(12) United States Patent
Tachi et al.

(10) Patent No.: US 11,264,102 B2
(45) Date of Patent: Mar. 1, 2022

(54) SEMICONDUCTOR STORAGE DEVICE

(71) Applicant: Kioxia Corporation, Minato-ku (JP)

(72) Inventors: Kiichi Tachi, Yokkaichi (JP); Takashi Hirotani, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/007,896

(22) Filed: Aug. 31, 2020

(65) Prior Publication Data

US 2021/0125673 A1    Apr. 29, 2021

(30) Foreign Application Priority Data

Oct. 29, 2019   (JP) .............................. JP2019-196728

(51) Int. Cl.
| | |
|---|---|
| *G11C 16/06* | (2006.01) |
| *G11C 16/24* | (2006.01) |
| *G11C 16/08* | (2006.01) |
| *G11C 16/34* | (2006.01) |
| *G11C 16/26* | (2006.01) |
| *G11C 16/10* | (2006.01) |

(52) U.S. Cl.
CPC ............. *G11C 16/24* (2013.01); *G11C 16/08* (2013.01); *G11C 16/10* (2013.01); *G11C 16/26* (2013.01); *G11C 16/3459* (2013.01)

(58) Field of Classification Search
CPC ......... G11C 16/24; G11C 16/10; G11C 16/08; G11C 16/26; G11C 16/3459
See application file for complete search history.

(56) References Cited

U.S. PATENT DOCUMENTS

| | | | | |
|---|---|---|---|---|
| 7,787,305 | B2 * | 8/2010 | Kim ...................... | G11C 16/10 |
| | | | | 365/185.19 |
| 8,320,187 | B2 * | 11/2012 | Nagao ................ | G11C 16/3459 |
| | | | | 365/185.22 |
| 9,171,598 | B2 * | 10/2015 | Toda ................... | G11C 13/0002 |
| 9,859,015 | B2 | 1/2018 | Kim et al. | |
| 10,153,050 | B2 | 12/2018 | Kim et al. | |
| 2021/0272627 | A1 * | 9/2021 | Lee ..................... | G11C 13/0026 |

FOREIGN PATENT DOCUMENTS

| | | | |
|---|---|---|---|
| JP | | 5330425 B2 | 10/2013 |
| JP | | 5784788 B2 | 9/2015 |

* cited by examiner

*Primary Examiner* — Pho M Luu

(74) *Attorney, Agent, or Firm* — Oblon, McClelland, Maier & Neustadt, L.L.P.

(57) ABSTRACT

A semiconductor storage device includes a bit line driver, and a control circuit configured to be able to execute a writing sequence for repeating at least one loop including a program operation for writing data into at least one of the plurality of memory cells and a verify operation for verifying the data a plurality of times while increasing a program voltage by a step-up voltage. The bit line driver can obtain a number of memory cells into which writing is completed or a number of memory cells into which writing is insufficient for each of the at least two consecutive loops from a result of the verify operation, and the control circuit can determine the step-up voltage in the subsequent loop based on a result obtained by the bit line driver.

17 Claims, 16 Drawing Sheets

FIG. 8

| NUMBER OF TIMES OF LOOP / VERIFY LEVEL | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| A VERIFY LEVEL | O | O | O | O | O | O | | | | | | | | | | | | |
| B VERIFY LEVEL | | | O | O | O | O | O | O | | | | | | | | | | |
| C VERIFY LEVEL | | | | | O | O | O | O | O | O | | | | | | | | |
| D VERIFY LEVEL | | | | | | | | O | O | O | O | O | | | | | | |
| E VERIFY LEVEL | | | | | | | | | | O | O | O | O | O | | | | |
| F VERIFY LEVEL | | | | | | | | | | | | O | O | O | O | O | | |
| G VERIFY LEVEL | | | | | | | | | | | | | | O | O | O | O | O |

FIG. 11

| LOOP | VERIFY LEVEL | | | | | | | VERIFY PASS CELL TO BE DETECTED | | ΔVPGM |
|---|---|---|---|---|---|---|---|---|---|---|
| | A | B | C | D | E | F | G | (N-2)TH LOOP | (N-1)TH LOOP | N-TH LOOP |
| 1 | O | | | | | | | - | - | - |
| 2 | O | | | | | | | - | - | - |
| 3 | O | | | | | | | A1 | A2 | ΔVPGM_3 |
| 4 | O | O | | | | | | A2 | A3 | ΔVPGM_4 |
| 5 | O | O | | | | | | A3 | A4 | ΔVPGM_5 |
| 6 | O | O | | | | | | B4 | B5 | ΔVPGM_6 |
| 7 | | O | O | | | | | B5 | B6 | ΔVPGM_7 |
| 8 | | O | O | | | | | C6 | C7 | ΔVPGM_8 |
| 9 | | | O | O | | | | C7 | C8 | ΔVPGM_9 |
| 10 | | | O | O | | | | D8 | D9 | ΔVPGM_10 |
| 11 | | | | O | O | | | D9 | D10 | ΔVPGM_11 |
| 12 | | | | O | O | O | | E10 | E11 | ΔVPGM_12 |
| 13 | | | | | O | O | | E11 | E12 | ΔVPGM_13 |
| 14 | | | | | O | O | O | F12 | F13 | ΔVPGM_14 |
| 15 | | | | | | O | O | F13 | F14 | ΔVPGM_15 |
| 16 | | | | | | O | O | G14 | G15 | ΔVPGM_16 |
| 17 | | | | | | | O | G15 | G16 | ΔVPGM_17 |
| 18 | | | | | | | O | G16 | G17 | ΔVPGM_18 |

| $T_{n-1} - T_{n-2}$ PER 1kB | $\Delta VPGM$ [V] |
|---|---|
| ~10 | V1 |
| 11~50 | V2 |
| 51~100 | V3 |
| 101~500 | V4 |
| 501~1000 | V5 |
| 1001~ | V6 |

SEMICONDUCTOR STORAGE DEVICE

CROSS REFERENCE TO RELATED APPLICATION

This application is based upon and claims the benefit of priority from the prior Japanese Patent Application No. 2019-196728 filed in Japan on Oct. 29, 2019, the entire contents of which are incorporated herein by reference.

FIELD

An embodiment described herein relates generally to a semiconductor storage device.

BACKGROUND

In recent years, a semiconductor storage device such as a NAND-type flash memory has been three-dimensionally structured in response to requests for miniaturization and larger capacity. In the NAND-type flash memory, a memory cell may be configured as not only an SLC (single level cell) capable of holding 1-bit (2-valued) data but also an MLC (multi level cell) capable of holding 2-bit (4-valued) data, a TLC (triple level cell) capable of holding 3-bit (8-valued) data, or a QLC (quad level cell) capable of holding 4-bit (16-valued) data.

If the memory cell is thus multivalued, a threshold voltage of the memory cell is requested to be controlled with high accuracy. However, there have been problems that when the memory cell is three-dimensionally structured, difficulties of film formation and processing become high, and a writing performance and a threshold distribution easily vary.

BRIEF DESCRIPTION OF THE DRAWINGS

FIG. 8 is a diagram for describing a standard writing sequence;

FIG. 11 is an explanatory diagram for describing loops used for determining a step-up voltage ΔVPGM using a writing sequence of 18 loops as an example;

DETAILED DESCRIPTION

According to one embodiment, a semiconductor storage device includes a plurality of memory cells, a word line connected to respective gates of the plurality of memory cells, a word line driver configured to be able to apply a program voltage to the word line when writing data into the plurality of memory cells, a plurality of bit lines electrically connected to respective one ends of the plurality of memory cells, a bit line driver configured to be able to detect data in the plurality of memory cells via the plurality of bit lines by applying a bit line voltage to the plurality of bit lines, and a control circuit configured to control the word line driver and the bit line driver, to be able to execute a writing sequence for repeating at least one loop including a program operation for writing data into at least one of the plurality of memory cells and a verify operation for verifying the data written into the at least one of the plurality of memory cells a plurality of times while increasing the program voltage by a step-up voltage, in which the bit line driver can obtain a number of memory cells into which writing is completed or a number of memory cells into which writing is insufficient for each of the at least two consecutive loops from a result of the verify operation, and the control circuit can determine the step-up voltage in the subsequent loop based on a result obtained by the bit line driver.

An embodiment of the present invention will be described in detail below with reference to the drawings.

The present embodiment enables a device characteristic that hardly varies by controlling a program voltage in a subsequent loop according to a result of writing in a plurality of loops of a writing sequence into memory cells.

(Configuration of Memory System)

Figure 1:
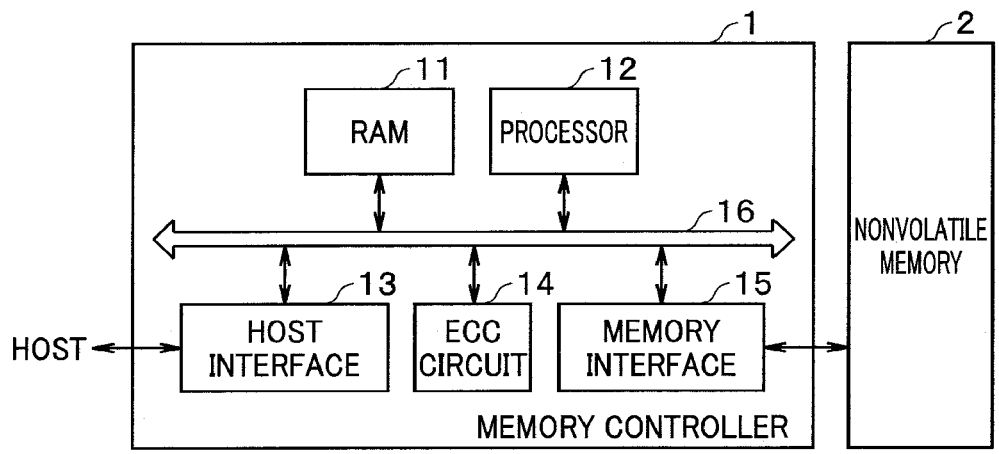
FIG. 1 is a block diagram illustrating a configuration example of a memory system according to an embodiment.

FIG. 1 is a block diagram illustrating a configuration example of a memory system according to the embodiment. The memory system according to the present embodiment includes a memory controller 1 and a nonvolatile memory 2. The memory system is connectable to a host. An example of the host is an electronic device such as a personal computer or a portable terminal.

The nonvolatile memory 2 is a semiconductor storage device configured to store data in a nonvolatile manner, and includes a NAND flash memory, for example. Although the nonvolatile memory 2 is described as a NAND memory having memory cells capable of each storing three bits, i.e., a 3-bit/cell (TLC: triple level cell) NAND memory in the embodiment, the present invention is not limited to this. The nonvolatile memory 2 is made three-dimensional.

The memory controller 1 controls writing of data into the nonvolatile memory 2 according to a writing request from the host. The memory controller 1 controls reading of data from the nonvolatile memory 2 according to a reading request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to one another via an internal bus 16.

The host interface 13 outputs to the internal bus 16 a request received from the host, writing data as user data, or the like. The host interface 13 transmits to the host user data read out of the nonvolatile memory 2, a response from the processor 12, or the like.

The memory interface 15 controls processing for writing the user data or the like into the nonvolatile memory 2 based on an instruction from the processor 12 and processing for reading out the user data or the like from the nonvolatile memory 2.

The processor 12 integrally controls the memory controller 1. Examples of the processor 12 include a CPU (central processing unit) and an MPU (micro processing unit). Upon receiving a request from the host via the host interface 13, the processor 12 performs control according to the request. For example, the processor 12 instructs the memory interface 15 to write user data and a parity to the nonvolatile memory 2 according to the request from the host. The processor 12 instructs the memory interface 15 to read out user data and a parity from the nonvolatile memory 2 according to the request from the host.

The processor 12 determines a storage region (hereinafter referred to as a memory region) on the nonvolatile memory 2 for user data to be stored in the RAM 11. The user data is stored in the RAM 11 via the internal bus 16. The processor 12 determines the memory region for data in a unit of pages as a writing unit, i.e., page data. In the present specification, user data to be stored in one page of the nonvolatile memory 2 is defined as unit data. The unit data is coded and is stored as a codeword in the nonvolatile memory 2, for example.

Note that the coding is not essential. Although the memory controller 1 may store the unit data in the nonvolatile memory 2 without coding the unit data, a configuration for performing coding is illustrated as a configuration example in FIG. 1. If the memory controller 1 does not perform coding, the page data matches the unit data. One codeword may be generated based on one unit data, or one codeword may be generated based on division data obtained by dividing the unit data. One codeword may be generated using a plurality of unit data.

The processor 12 determines a memory region of the nonvolatile memory 2 which is a writing destination for each unit data. A physical address is assigned to the memory region of the nonvolatile memory 2. The processor 12 manages the memory region which is the writing destination of the unit data using the physical address. The processor 12 designates the physical address assigned to the determined memory region and instructs the memory interface 15 to write user data into the nonvolatile memory 2. The processor 12 manages a correspondence between a logical address of the user data (a logical address to be managed by the host) and a physical address. Upon receiving a reading request including a logical address from the host, the processor 12 specifies a physical address corresponding to the logical address, designates the physical address and instructs the memory interface 15 to read out user data.

The ECC circuit 14 codes the user data stored in the RAM 11, and generates a codeword. The ECC circuit 14 decodes the codeword read out of the nonvolatile memory 2.

The RAM 11 temporarily stores user data received from the host until the user data is stored in the nonvolatile memory 2, or temporarily stores data read out of the nonvolatile memory 2 until the data is transmitted to the host. An example of the RAM 11 is a general purpose memory such as an SRAM (static random access memory) or a DRAM (dynamic random access memory).

In FIG. 1, a configuration example in which the memory controller 1 includes the ECC circuit 14 and the memory interface 15 is illustrated. However, the ECC circuit 14 may be contained in the memory interface 15. The ECC circuit 14 may be contained in the nonvolatile memory 2.

Upon receiving a writing request from the host, the memory controller 1 operates in the following manner. The processor 12 temporarily stores writing data in the RAM 11. The processor 12 reads out the data stored in the RAM 11, and inputs the read data to the ECC circuit 14. The ECC circuit 14 codes the inputted data, and provides a codeword to the memory interface 15. The memory interface 15 writes the inputted codeword into the nonvolatile memory 2.

Upon receiving a reading request from the host, the memory controller 1 operates in the following manner. The memory interface 15 provides a codeword read out of the nonvolatile memory 2 to the ECC circuit 14. The ECC circuit 14 decodes the inputted codeword, and stores data of the decoded codeword in the RAM 11. The processor 12 transmits the data stored in the RAM 11 to the host via the host interface 13.

Figure 2:
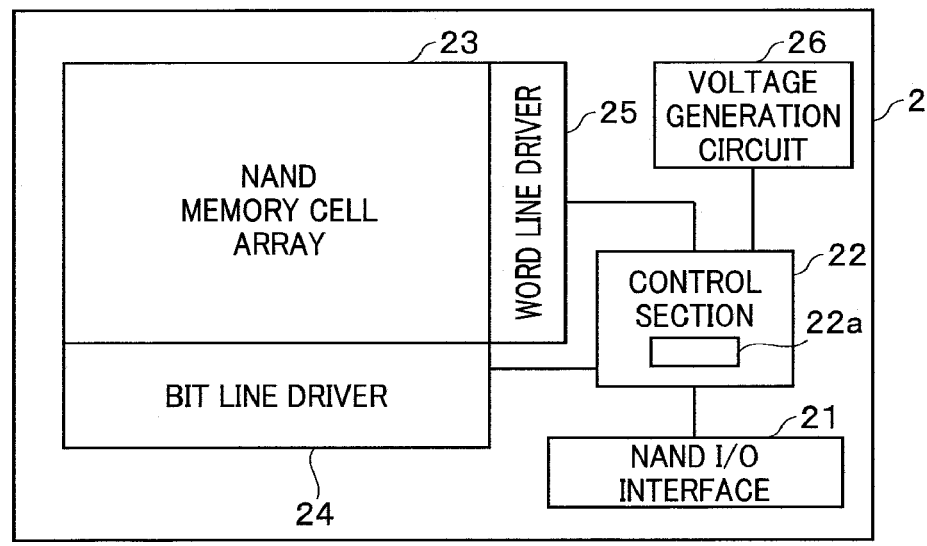
FIG. 2 is a block diagram illustrating a configuration example of a nonvolatile memory according to the present embodiment.

FIG. 2 is a block diagram illustrating a configuration example of the nonvolatile memory according to the present embodiment. The nonvolatile memory 2 includes a NAND I/O interface 21, a control section 22, a NAND memory cell array 23, a bit line driver 24, and a word line driver 25. The nonvolatile memory 2 is composed of a single-chip semiconductor substrate (e.g., a silicon substrate), for example.

The NAND I/O interface 21 receives a control signal, such as a writing enable signal WEn, a reading enable signal REn, an address latch enable signal ALE, or a command latch enable signal CLE, outputted from the memory controller 1. The NAND I/O interface 21 receives a command, an address, and data outputted from the memory controller 1.

The control section (control circuit) 22 receives the control signal, the command, the address, and the data from the NAND I/O interface 21, and controls an operation of the nonvolatile memory 2 based on the received control signal, command, address, and data. The control section 22 controls the word line driver 25 and the bit line driver 24 based on the control signal, the command, the address, and the data, for example, to perform a writing operation, a reading operation, an erasure operation, and the like.

Upon receiving a writing command, the control section 22 controls the bit line driver 24 and the word line driver 25 to write data inputted with the writing command into an address designated on the NAND memory cell array 23. Upon receiving a reading command, the control section 22 controls the bit line driver 24 and the word line driver 25 to read out data from an address designated on the NAND memory cell array 23.

For example, the control section 22 controls a voltage to be applied to a plurality of word lines WL by the word line driver 25 and a voltage (bit line voltage) to be applied to a plurality of bit lines BL by the bit line driver 24 to write data into a memory cell (memory cell transistor) MT included in the NAND memory cell array 23.

The bit line driver 24 is configured to be able to independently apply voltages (or currents) to the plurality of bit lines BL and independently detect the voltages (or currents) of the plurality of bit lines BL. The word line driver 25 is configured to be able to independently apply voltages to the plurality of word lines and a selection gate line.

A voltage generation circuit 26 is controlled by the control section 22, to generate a voltage to be supplied to the bit line driver 24 and the word line driver 25.

(Configuration of NAND Memory Cell Array)

Figure 3:
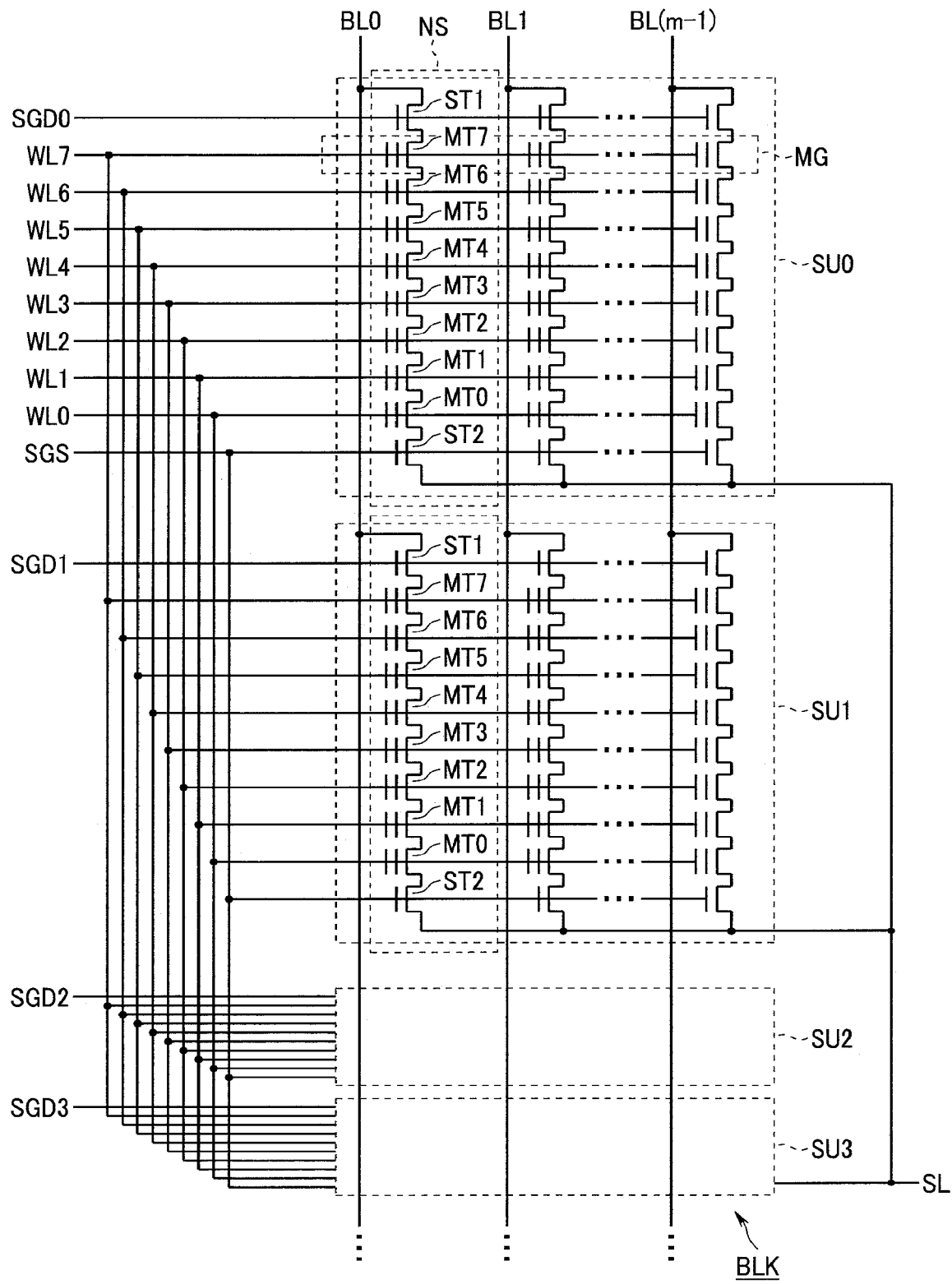
FIG. 3 is a diagram illustrating a configuration example of a block in a NAND memory cell array having a three-dimensional structure.

FIG. 3 is a diagram illustrating a configuration example of a block in the NAND memory cell array (hereinafter referred to as memory cell array) 23 having a three-dimensional structure. FIG. 3 illustrates one block BLK among a plurality of blocks constituting the memory cell array 23. The other block in the memory cell array has a similar configuration to the configuration illustrated in FIG. 3. Note that the present embodiment is also applicable to a memory cell array having a two-dimensional structure.

As illustrated, the block BLK includes four string units (SU0 to SU3), for example. Each of the string units SU includes a plurality of NAND strings NS. Each of the NAND strings NS includes eight memory cells MT (MT0 to MT7) and selection transistors ST1 and ST2. Note that although the number of memory cells MT included in the NAND string NS is eight, the number of memory cells MT is not limited to eight, but may be 32, 48, 64, 96, or the like. Although the selection transistors ST1 and ST2 are represented as one transistor on an electrical circuit, each of the selection transistors may be the same as a memory cell transistor in structure. To enhance a cutoff characteristic, for example, a plurality of selection transistors may be used as each of the selection transistors ST1 and ST2. Further, a dummy cell transistor DT may be provided between the memory cell MT and each of the selection transistor ST1 and ST2.

The memory cells MT are arranged to be connected in series between the selection transistors ST1 and ST2. The memory cell MT7 on the one end side is connected to the selection transistor ST1, and the memory cell MT0 on the other end side is connected to the selection transistor ST2.

The selection transistors ST1 in the string units SU0 and SU3 have their respective gates connected to select gate lines SGD0 to SGD3. On the other hand, the selection transistors ST2 have their respective gates commonly connected to the same select gate line SGS among the plurality of string units SU within the same block BLK. The memory cells MT0 to the memory cells MT7 in the string units SU0 to SU3 within the same block BLK have their respective gates commonly connected, respectively, to the word lines WL0 to WL7. In other words, the word lines WL0 to WL7 and the select gate line SGS are common among the plurality of string units SU0 to SU3 within the same block BLK. On the other hand, the select gate lines SGD are respectively independent for the string units SU0 to SU3 even within the same block BLK.

The word lines WL0 to WL7 are respectively connected to the respective gates of the memory cells MT0 to MT7 constituting each of the NAND strings NS. The respective gates of the memory cells MTi on the same row within the block BLK are connected to the same word line WLi. Note that the NAND string NS may be merely referred to as a "string" in the following description.

Each of the NAND strings NS is connected to the corresponding bit line. Therefore, each of the memory cells MT is connected to the bit line via the selection transistors ST and the other memory cells MT included in the NAND string NS. As described above, respective data in the memory cells MT within the same block BLK are collectively erased. On the other hand, the data are read out and written in a unit of memory cell groups MG (or in a unit of pages). In the present specification, the plurality of memory cells MT connected to the one word line WLi and belonging to the one string unit SU are defined as a memory cell group MG. In the present embodiment, the nonvolatile memory 2 is a TCL NAND memory capable of holding 3-bit (8-valued) data. Therefore, the one memory cell group MG can hold data corresponding to three pages. Three bits that can be held by each of the memory cells MT respectively correspond to the three pages.

Figure 4:
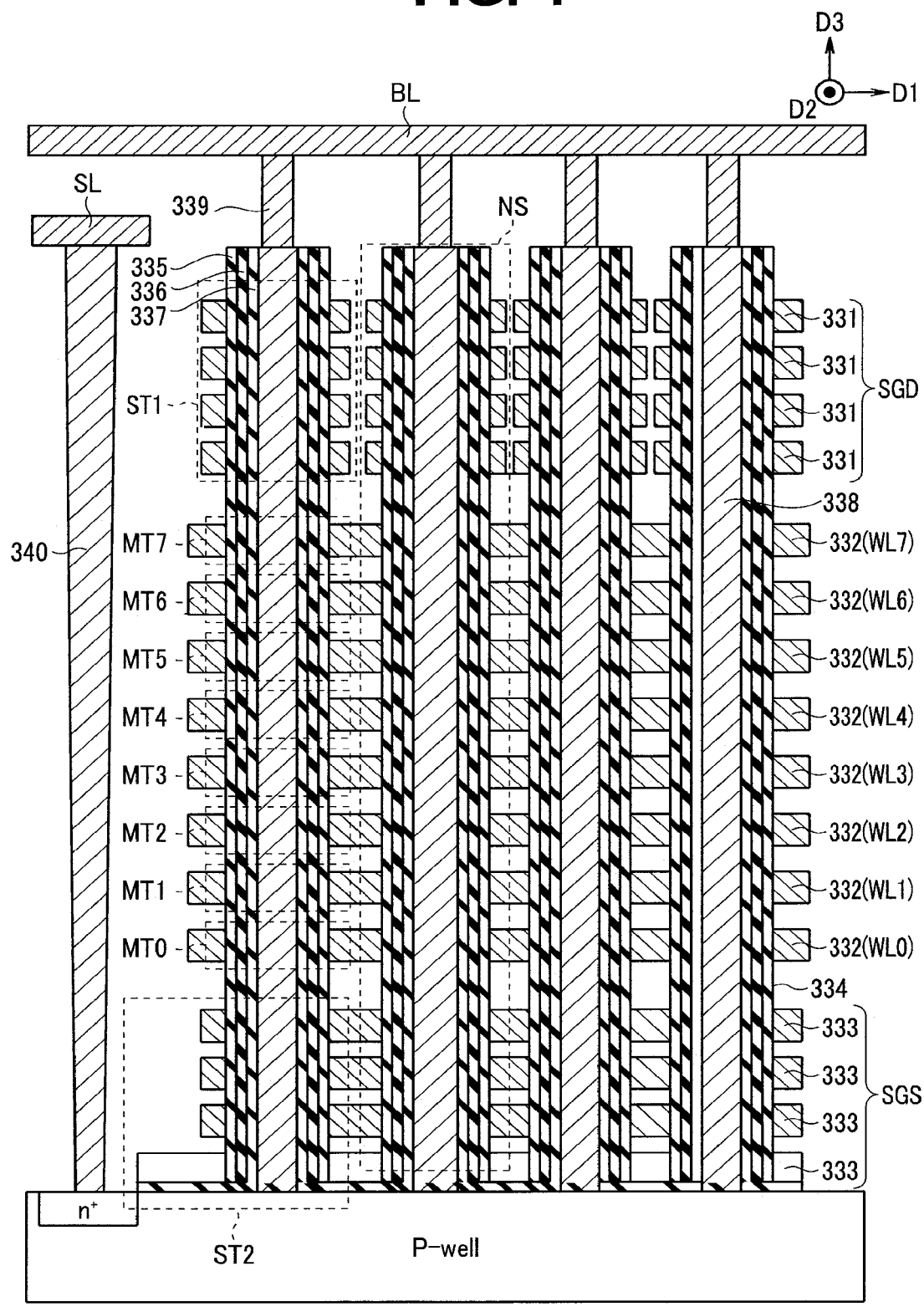
FIG. 4 is a cross-sectional view illustrating a partial region of the NAND memory cell array having a three-dimensional structure.

FIG. 4 is a cross-sectional view illustrating a partial region of the NAND memory cell array having a three-dimensional structure. As illustrated in FIG. 4, a plurality of NAND strings NS are formed on a p-type well region (P-well). In other words, a plurality of wiring layers 333 functioning as a select gate line SGS, a plurality of wiring layers 332 each functioning as a word line WLi, and a plurality of wiring layers 331 functioning as a select gate line SGD are stacked on the p-type well region.

A memory hole 334, which reaches the p-type well region by penetrating the wiring layers 333, 332, and 331, is formed. A block insulating film 335, a charge storage film (charge holding region) 336, and a gate insulating film 337 are sequentially formed on a side surface of the memory hole 334, and a conductor column 338 is further embedded in the memory hole 334. The conductor column 338 is made of polysilicon, for example, and functions as a region where a channel is formed when memory cells MT and selection transistors ST1 and ST2 included in each of the NAND strings NS operate. In other words, the wiring layers 331, the conductor column 338, and the films 335 to 337 between the wiring layers 331 and the conductor column 338 function as the selection transistor ST1, each of the wiring layers 332, the conductor column 338, and the films 335 to 337 between the wiring layer 332 and the conductor column 338 function as the memory cell MT, and the wiring layers 333, the conductor column 338, and the films 335 to 337 between the wiring layers 333 and the conductor column 338 function as the selection transistor ST2.

Note that although the memory hole 334 and the conductor column 338 are illustrated as being respectively columnar shapes having the same diameter in FIG. 4, the memory hole 334 and the conductor column 338 respectively have tapered shapes diameters of which decrease toward the p-type well region in practice. Depending on a manufacturing process, the memory hole 334 and the conductor column 338 may respectively have tapered shapes each having a plurality of stages diameters of which increase in the middle of the tapered shapes and decrease toward the p-type well region again.

In each of the NAND strings NS, the selection transistor ST2, the plurality of memory cells MT, and the selection transistor ST1 are sequentially formed on the p-type well region. A wiring layer functioning as a bit line BL is formed above the conductor column 338. A contact plug 339 configured to connect the conductor column 338 and the bit line BL to each other is formed at an upper end of the conductor column 338.

Further, an $n^+$-type impurity diffusion layer and a $p^+$-type impurity diffusion layer are formed within a surface of the p-type well region. A contact plug 340 is formed on the $n^+$-type impurity diffusion layer, and a wiring layer functioning as a source line SL is formed on the contact plug 340.

A plurality of configurations illustrated in FIG. 4, described above, are arranged in a depth direction of a plane of FIG. 4, and a set of a plurality of NAND strings arranged in one column in the depth direction forms one string unit SU.

An operation for writing data into the memory cells MT roughly includes a program operation and a verify operation. The program operation means an operation for injecting electrons into the charge storage film 336 to raise a threshold voltage of the memory cells MT (or preventing the electrons from being injected to maintain the threshold voltage). At the time of the program operation, the control section 22 controls the word line driver 25 to apply a program voltage VPGM to the word line WL connected to the target memory cell MT, and controls the bit line driver 24 to apply a bit line voltage corresponding to data to be written to the bit line BL connected to the target memory cell MT. The bit line voltage and the program voltage VPGM are generated by the voltage generation circuit 26 and are supplied to the bit line driver 24 and the word line driver 25.

Hereinafter, an operation for raising the threshold voltage is referred to as a '"0" program' or '"0" writing', and an operation for maintaining the threshold voltage is referred to as a '"1" program', '"1" writing', or "writing inhibition". A bit line voltage Vb1_L corresponding to "0" data is applied to the bit line BL set as a "0" program target. A bit line voltage Vb1_H corresponding to "1" data is applied to the bit line BL set as a "1" program target. For example, the bit line voltage Vb1_L is 0 V, and the bit line voltage Vb1_H is 2.5 V.

(Threshold Distribution)

When multivalued data is written into the memory cells MT, the threshold voltage of the memory cells MT is set to a value corresponding to a value of the data. When the program voltage VPGM and the bit line voltage Vb1_L are applied to the memory cells MT, electrons are injected into the charge storage film 336 so that the threshold voltage rises. By increasing the program voltage VPGM, an amount of electrons to be injected increases, and the threshold voltage of the memory cells MT can be increased. However, even if the same program voltage VPGM is applied to the memory cells MT, an amount of electrons to be injected differs for each of the memory cells MT due to a variation among the memory cells MT. The electrons once injected are held until an erasure operation is performed. A writing operation is performed a plurality of times to gradually raise the program voltage VPGM such that the threshold voltage does not exceed a range of the threshold voltage (hereinafter referred to as a target region) that can be permitted as a threshold voltage to be set in each of the memory cells MT.

After the program operation, by reading out data, the verify operation for judging whether or not the threshold voltage of the memory cells has reached the target region is performed. By repeating a combination of the above-described program operation and verify operation, the threshold voltage of the memory cells is raised to the target region. The memory cell the threshold voltage of which is judged, by the verify operation, to have reached the target region i.e., have exceeded a target level as a minimum value of the target region, is then prohibited from being written in.

Figure 5:
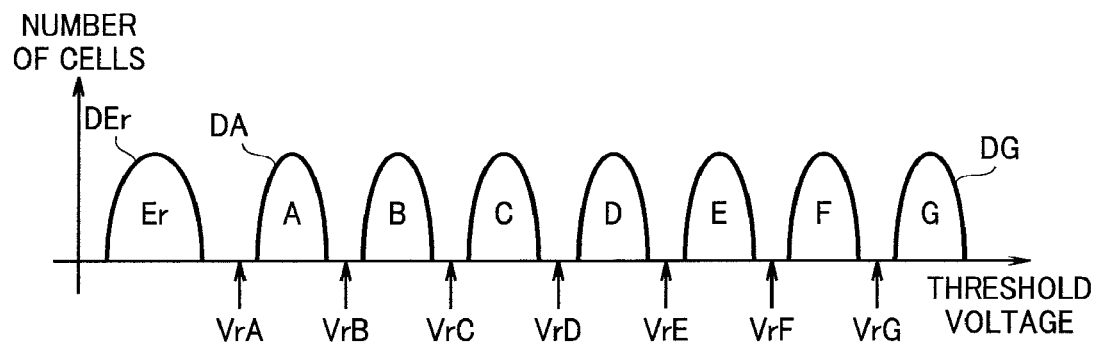
FIG. 5 is a diagram illustrating a threshold distribution in the memory cell array with a threshold voltage on a horizontal axis and the number of memory cells (the number of cells) on a vertical axis.

FIG. 5 is a diagram illustrating a threshold distribution in a memory cell array with a threshold voltage on a horizontal axis and the number of memory cells (the number of cells) on a vertical axis. FIG. 5 illustrates an example of a threshold distribution in the 3-bit/cell nonvolatile memory 2. In the nonvolatile memory 2, a threshold voltage of memory cells MT is set depending on each of data values of multi-valued data to be stored in the memory cells MT. Since injection of a charge into the charge storage film (charge holding region) is probabilistic, respective threshold voltages of the memory cells MT are also statistically distributed, as illustrated in FIG. 5.

FIG. 5 illustrates a threshold distribution as eight mountain-shaped regions DEr, DA, DB, DC, . . . , DG, and widths of threshold voltages in the regions respectively correspond to target regions. In an example illustrated in FIG. 5, by the threshold voltage of the memory cells MT being set within any one of the eight target regions, 8-valued data (3-bit data) can be stored in the memory cells MT.

In the present embodiment, the target region where a threshold voltage Vth is a voltage VrA illustrated in FIG. 5 or less is referred to as an Er level, the target region where the threshold voltage is more than the voltage VrA and a voltage VrB or less is referred to as an A level, the target region where the threshold voltage is more than the voltage VrB and a voltage VrC or less is referred to as a B level, and the target region where the threshold voltage is more than the voltage VrC and a voltage VrD or less is referred to as a C level. In a similar manner, a D level to a G level are set depending on respective voltages, as illustrated in FIG. 5.

In other words, the level indicates any one of the target regions respectively corresponding to data values to be stored in the memory cells MT. The target regions are separated among eight levels Er and A to G when data is a 3-bit 8-valued data. Note that threshold distributions corresponding to the Er, A, B, . . . , F, and G levels are respectively referred to as distributions DEr, DA, DB, . . . , DF, and DG. Voltages VrA to VrG are respectively reference voltages which are boundaries among the target regions. Note that in the verify operation, each of the voltages VrA to VrG as a verify level (voltage) may be applied to the word line WL to perform reading, and it may be judged that a threshold voltage corresponding to the level has been reached when the target memory cell MT enters an off state. Note that in the following description, the verify voltages VrA to VrG used to verify the A to G levels may be respectively referred to as A to G verify levels.

(Writing Operation)

Figure 6:
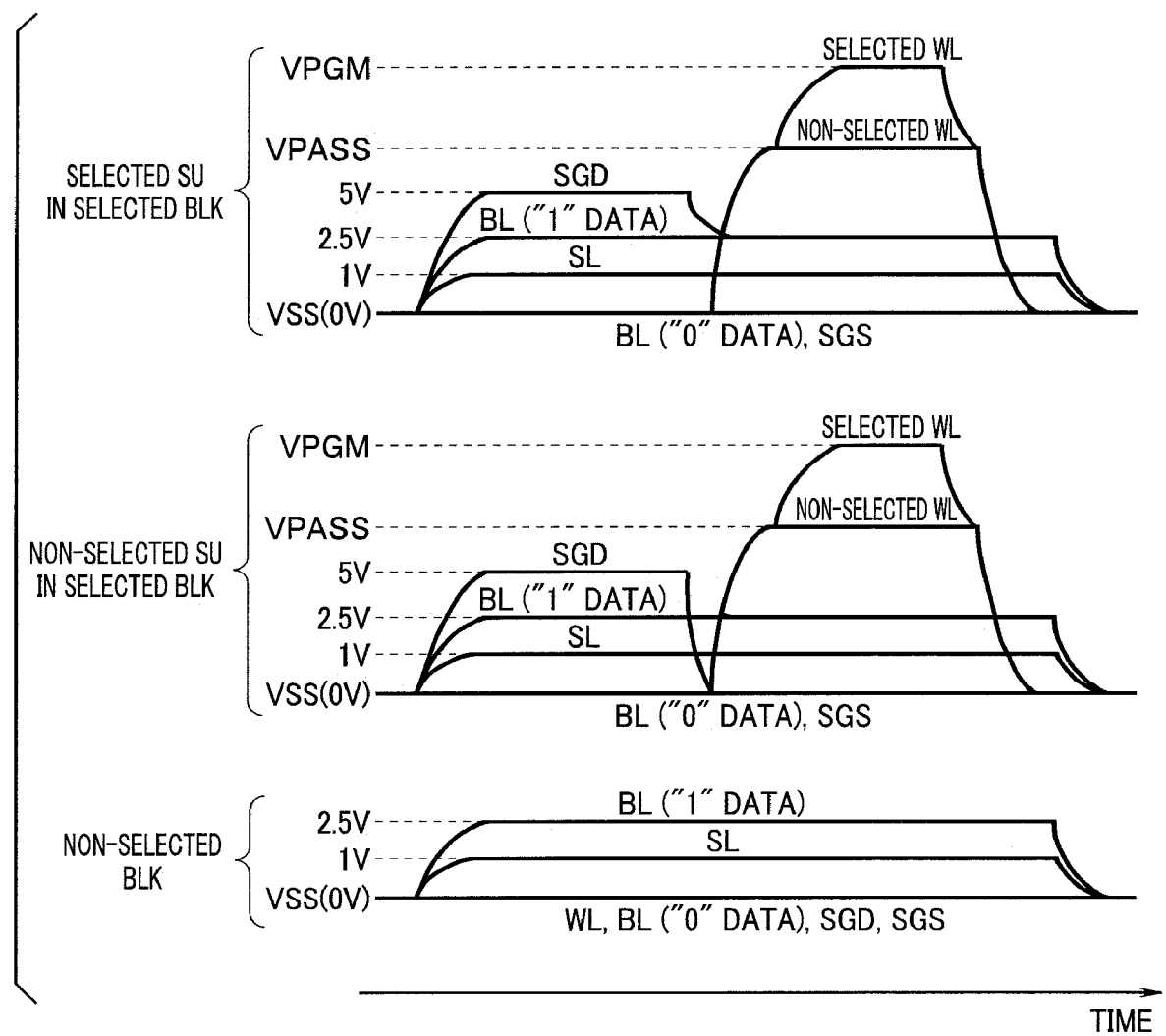
FIG. 6 is a diagram illustrating a potential change of each wiring at the time of a writing operation.

FIG. 6 is a diagram illustrating a potential change of each wiring at the time of a writing operation. FIG. 6 illustrates a potential change of each wiring at the time of a program operation. Note that each of voltages illustrated in FIG. 6 is also generated by the voltage generation circuit 26 controlled by the control section 22.

The program operation is performed according to a program voltage and a bit line voltage to be respectively applied to word lines and bit lines. A block BLK in which a voltage is not applied to word lines (a selected WL and a non-selected WL illustrated in FIG. 6) is a non-selected BLK into which data is not to be written (in a lower part of FIG. 6). The bit line voltage is applied to a memory cell MT when the selection transistor ST1 connected to a bit line BL is rendered conductive. Thus, a string unit SU in which no voltage is applied to the select gate line SGD in a block BLK (selected BLK) into which data is to be written is a non-selected SU into which data is not to be written (in a middle part of FIG. 6). Note that for the non-selected SU in the selected BLK (in a middle part of FIG. 6), the selection transistor ST1 may be rendered conductive by setting the select gate line SGD to 5 V, for example, before the program voltage VPGM is applied.

For the string unit SU (selected SU) into which data is to be written in the block BLK (selected BLK) into which data is to be written (in an upper part of FIG. 6), the selection transistor ST1 is rendered conductive by setting the select gate line SGD to 5 V, for example, as illustrated on the left side of the upper part of FIG. 6, before the program voltage VPGM is applied. At the time of the writing operation, the select gate line SGS is 0 V, for example. Therefore, the selection transistor ST2 is turned off. On the other hand, when the program voltage VPGM illustrated on the right side of the upper part of FIG. 6 is applied, the select gate line SGD is set to 2.5 V, for example. As a result, it is determined depending on a bit line voltage of the bit line BL connected to the selection transistor ST1 whether the selection transistor ST1 is in a conductive or non-conductive state.

As described above, the bit line driver 24 transfers data to each of the bit lines BL. A ground voltage Vss of 0 V, for example, is applied as a bit line voltage Vb1_L to the bit line BL to which "0" data has been applied. A writing inhibition voltage Vinhibit (e.g., 2.5 V) is applied as a bit line voltage Vb1_H to the bit line BL to which "1" data has been applied. Therefore, when the program voltage VPGM is applied, the selection transistor ST1 connected to the bit line BL to which "0" data has been applied is rendered conductive, and the selection transistor ST1 connected to the bit line BL to which "1" data has been applied is cut off. The memory cell MT connected to the selection transistor ST1 cut off is inhibited from being written in.

In the memory cell MT connected to the selection transistor ST1 that has been in a conductive state, electrons are injected into a charge storage film according to a voltage to be applied to the word line WL. Although the memory cell MT connected to the word line WL to which a voltage VPASS has been applied as a word line voltage is in the conductive state regardless of a threshold voltage, electrons are not injected into the charge storage film. On the other hand, in the memory cell MT connected to the word line WL to which the program voltage VPGM has been applied as a word line voltage, electrons are injected into the charge storage film depending on the program voltage VPGM.

In other words, the word line driver 25 selects any one of the word lines WL in the selected block BLK, applies the voltage VPGM to the selected word line, and applies a voltage VPASS to the other non-selected word lines WL. The voltage VPGM is a high voltage for injecting electrons into the charge storage film by a tunneling phenomenon, where VPGM>VPASS. An operation for writing into each of the memory cells MT in the memory cell array 23 is performed by providing data to each of the bit lines BL by the bit line driver 24 while controlling a voltage of the word line WL by the word line driver 25.

Figure 7:
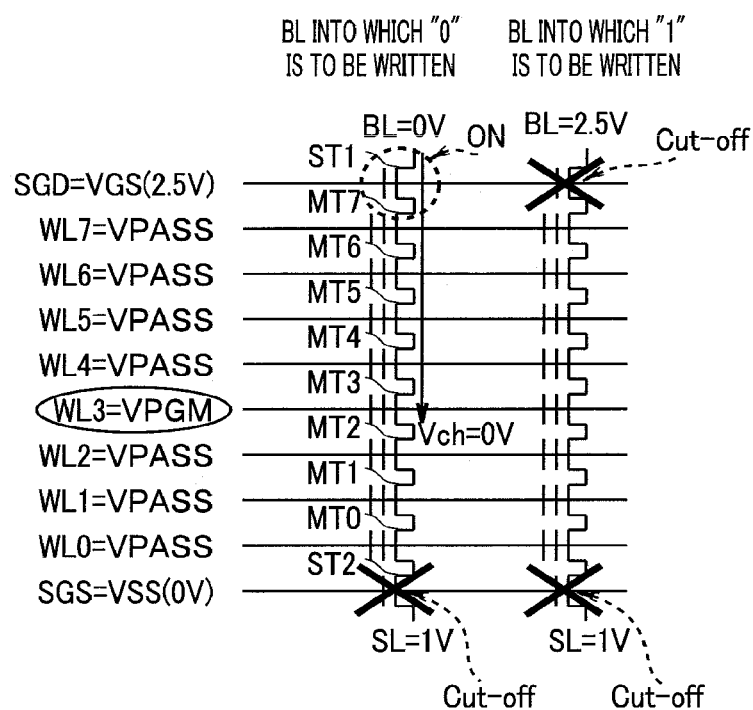
FIG. 7 is a circuit diagram illustrating respective states of strings at the time of a writing operation.

FIG. 7 is a circuit diagram illustrating respective states of strings at the time of a writing operation.

FIG. 7 illustrates two NAND strings respectively corresponding to a bit line BL into which "0" is to be written and a bit line BL into which "1" is to be written. FIG. 7 illustrates when a word line WL3 is selected.

As illustrated, a voltage VPGM is applied to the selected word line WL3, and a voltage VPASS is applied to non-selected word lines WL0 to WL2 and WL4 to WL7.

In the NAND string corresponding to the bit line BL into which "0" is to be written, a selection transistor ST1 enters an on state. Accordingly, a channel potential Vch of a memory cell MT3 connected to the selected word line WL3 is 0 V. In other words, a potential difference between a gate and a channel of the memory cell MT3 increases. As a result, electrons are injected into a charge storage film so that a threshold voltage of the memory cell MT3 is raised.

In the NAND string corresponding to the bit line BL into which "1" is to be written, the selection transistor ST1 is brought into a cut-off state. Accordingly, the channel of the memory cell MT3 connected to the selected word line WL3 is brought into an electrically floating state, and the channel potential Vch is raised to the vicinity of the voltage VPGM by capacitive coupling to a word line WL or the like. In other words, a potential difference between the gate and the channel of the memory cell MT3 decreases. As a result, electrons are not injected into the charge storage film so that the threshold voltage of the memory cell MT3 is maintained (the threshold voltage does not vary as a threshold distribution level shifts to a higher level).

(Standard Writing Sequence)

FIG. 8 is a diagram for describing a standard writing sequence. In FIG. 8, a case where data is written by repeating a combination of a program operation and a verify operation 18 times is illustrated as an example. Such a repetitive operation is referred to as a "loop". A program voltage VPGM in a 1st loop is set to a smallest voltage value, and the program voltage VPGM is gradually set to larger voltage values as the loop proceeds to a 2nd loop, a 3rd loop, and the like. A round mark in FIG. 8 represents a loop in which the verify operation can be performed. At A to G levels, the program operation is performed from respective 1st loops up to respective loops each including the round mark. The n-th loop among the 1st to 18th loops is hereinafter referred to as an n-th loop.

For a memory cell MT to be set to the B level, for example, the program operation may be performed while gradually increasing the program voltage VPGM from the 1st loop up to the 8th loop. The verify operation is performed in only the loops each including the round mark. A memory cell MT in which it is judged that a threshold voltage has reached a set target region by the verify operation is then prohibited from being written in.

Figure 9:
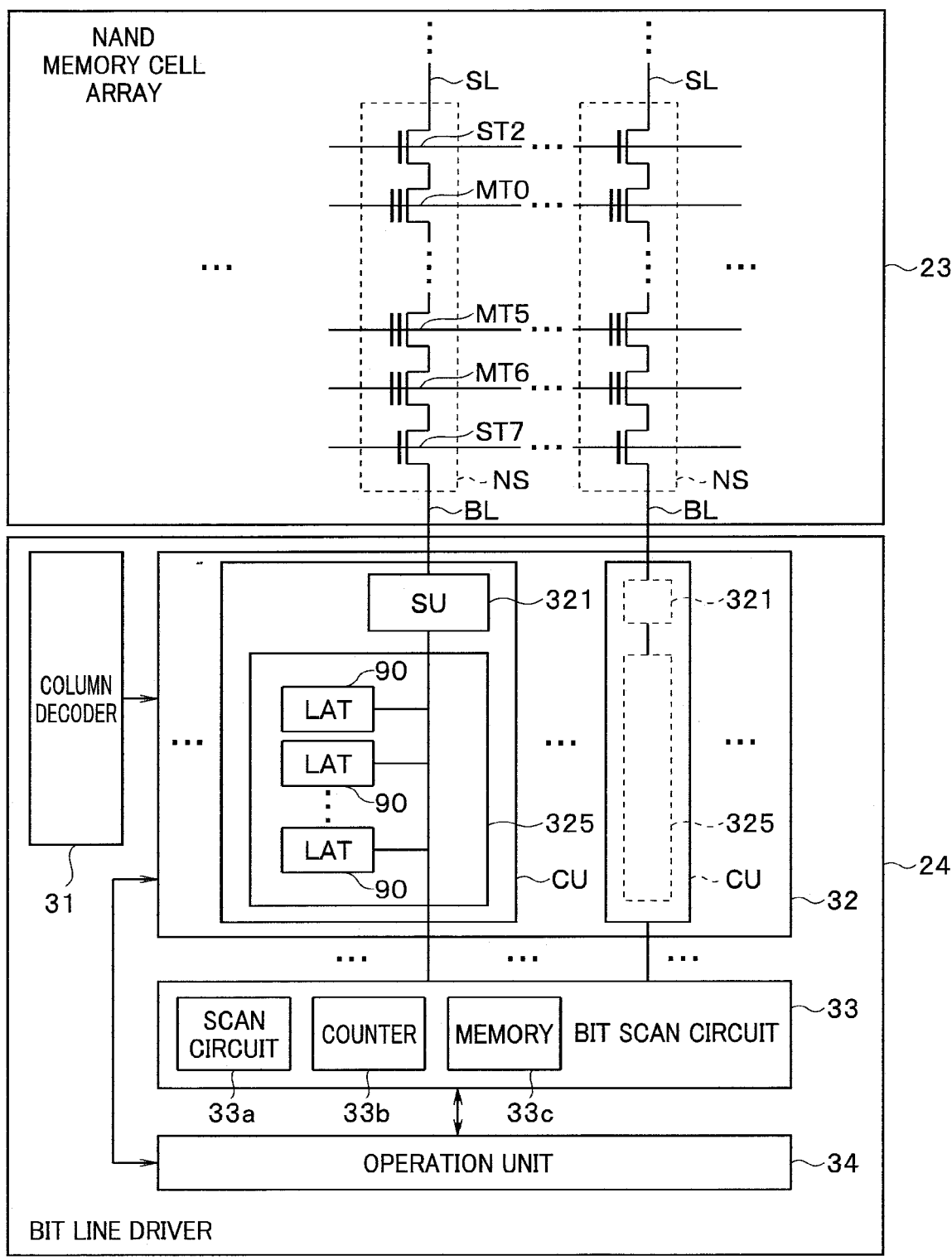
FIG. 9 is a circuit diagram schematically illustrating an example of an internal circuit of a bit line driver 24 configured to perform judgment in a verify operation.

FIG. 9 is a circuit diagram schematically illustrating an example of an internal circuit of the bit line driver 24 configured to perform judgment in a verify operation. The bit line driver 24 is connected to bit lines BL provided in the memory cell array 23. A sense amplifier circuit 32 in the bit line driver 24 detects and amplifies a potential variation of the bit line BL, and judges data stored in a memory cell.

The bit line driver 24 includes a column decoder 31, the sense amplifier circuit 32, a bit scan circuit 33, and an operation unit 34. The column decoder 31 selects the bit line BL in the memory cell array 23 based on a column address transferred from the control section 22, and drives the sense amplifier circuit 32.

The sense amplifier circuit 32 includes a plurality of column units CU. The column units CU are provided to respectively correspond to the bit lines BL. Each of the column units CU includes one sense unit (SU) 321 as a sense circuit and one latch circuit 325. The one sense unit 321 and the one latch circuit 325 are provided for the one bit line BL in the memory cell array 23 to correspond to the bit line BL. In other words, the one sense unit 321 and the one latch circuit 325 correspond to the one bit line BL and a NAND string NS connected to the bit line BL. The one sense unit 321 is connected to the bit line BL. The one latch circuit 325 is connected to the bit line BL via the sense unit 321.

The sense unit 321 charges or discharges the bit line BL under control of the column decoder 31 and the control section 22 at the time of data writing. The sense unit 321 detects a potential variation of the bit line BL and judges data at the time of data reading.

The latch circuit 325 temporarily holds data to be written into the memory cell, data read out of the memory cell, setting information (hereinafter referred to as a flag) representing an operation for the memory cell, and the like. The latch circuit 325 amplifies a signal from the sense unit 321 or a signal from outside.

The latch circuit 325 includes a plurality of latches (LATs) 90. In the present embodiment, the latch 90 configured to hold data is referred to as a data latch 90, and the latch 90 configured to hold the flag is referred to as a flag latch 90. The data latch 90 within the latch circuit 325 holds data (data from outside) to be written into a memory cell group MG corresponding to the latch circuit 325 at the time of data writing. The data latch 90 within the latch circuit 325 holds data (data from the memory cell) read out of the memory cell group MG corresponding to the latch circuit 325 at the time of data reading. The one data latch 90 holds 1-bit data.

For example, information representing completion of writing is held in the latch circuit 325 in the column unit CU corresponding to the memory cell (the memory cell that is verify-passed) into which writing of predetermined data is completed based on a verify result at the time of verify. As a result, data is prevented from being continuously written into the memory cell into which writing is completed.

The flag held by the flag latch 90 in the latch circuit 325 is, for example, information indicating whether inputted data is 2-valued (1-bit) data or multivalued (2-bit or more) data or information indicating in which writing mode data is to be written. For example, if the one memory cell stores 4-valued (2-bit) data, the latch circuit 325 includes two data latches 90. Out of the two data latches provided within the latch circuit 325, the one data latch 90 holds high-order one bit of two bits, and the other lower-order data latch 90 holds lower-order one bit of the two bits. The latch circuit 325 includes one or more flag latches 90. The latch circuit 325 includes the latch 90 configured to hold a verify result. The verify result (also referred to as verify information) may be written into the flag latch, or the like.

Although in the 4-valued data, at least two data latches and at least one flag latch are provided in the latch circuit 325, the number of data latches increases if the number of bits of the data increases. For example, if the memory cell MC stores 8-valued (3-bit) data, the latch circuit 325 includes three data latches. In other words, the latch circuit 325 includes the data latch configured to hold the most significant bit, the data latch configured to hold the least significant bit, and the data latch configured to hold one bit between the most significant bit and the least significant bit. Similarly, the number of data latches in the latch circuit 325 is four if the data is 16-valued (4-bit) data, and the number of data latches in the latch circuit 325 is five if the data is 32-valued (5-bit) data. The number of flag latches may be one or two or more depending on a specification of the memory.

In the present embodiment, the latch 90 stores at least one of information representing the number of memory cells that are verify-passed (hereinafter referred to as the number of verify pass cells) and information representing the number of memory cells that are verify-failed (hereinafter referred to as the number of verify fail cells).

(Verify Operation)

Next, an example of the verify operation will be described. First, the word line driver 25 applies a verify level (voltage) Vr corresponding to a desired level to a selected word line, and applies a non-selected reading voltage VPASS (e.g., 5 to 7 V) higher than the verify voltage Vr to a non-selected word line. At the time of the verify operation, the control section 22 controls the bit line driver 24 to fix a bit line BL at a predetermined voltage (e.g., 0.5 V) and charge a sense node SEN which is not illustrated within the sense unit 321 to a predetermined precharge voltage Vpre higher than the voltage of the bit line BL. In this state, the control section 22 connects a sense node SEN to the bit line BL. Consequently, a current flows through the bit line BL from the sense node SEN, and a voltage of the sense node SEN gradually decreases.

The voltage of the sense node SEN changes depending on a state of a threshold voltage of a memory cell to be verified (selected memory cell). In other words, when the threshold voltage of the selected memory cell is lower than the verify voltage Vr, the selected memory cell is in an on state, a large cell current flows through the selected memory cell, and a speed at which the voltage of the sense node SEN decreases becomes fast. When the threshold voltage of the selected memory cell is higher than the verify voltage Vr, the selected memory cell is off, a cell current flowing through the selected memory cell is small or a cell current does not flow through the selected memory cell, and a speed at which the voltage of the sense node SEN decreases becomes slow.

A state of writing into the selected memory cell is judged using a difference between the speeds at which the voltage of the sense node SEN decreases, and a verify result is stored in the latch 90. For example, at a first time point where a predetermined first period has elapsed from a discharge start time at which a charge in the sense node SEN starts to be discharged, it is judged whether a voltage of the sense node SEN is at a low level (hereinafter referred to as "L") or a high level (referred to as "H"). For example, when the selected memory cell is a writing insufficient cell, a threshold voltage of the selected memory cell is lower than the verify voltage Vr, and a difference between the threshold voltage and the verify voltage Vr is large. Accordingly, the selected memory cell is completely in the on state, and a large cell current flows through the selected memory cell. Accordingly, the voltage of the sense node SEN rapidly decreases, an amount of voltage drop is relatively large, and the sense node SEN is brought into "L" at the first time point.

When the selected memory cell is a writing completed cell, a threshold voltage of the selected memory cell is higher than the verify voltage Vr. Accordingly, the selected memory cell is in an off state, and a cell current flowing through the selected memory cell is significantly small or a cell current does not flow through the selected memory cell. Accordingly, the voltage of the sense node SEN very gently decreases, an amount of voltage drop is relatively small, and the sense node SEN remains at "H" at the first time point.

Thus, when the sense amplifier circuit 32 monitors a state of the sense node SEN while the word line driver 25 applies the verify voltage Vr to the selected word line, it is judged whether the selected memory cell is a writing insufficient cell or the selected memory cell is a writing completed cell.

The control section 22 generates a program voltage corresponding to a level of the memory cell MT into which data is to be written, a loop, or the like, based on a result of the judgment whether the selected memory cell is a writing insufficient cell or a writing completed cell.

Figure 10:
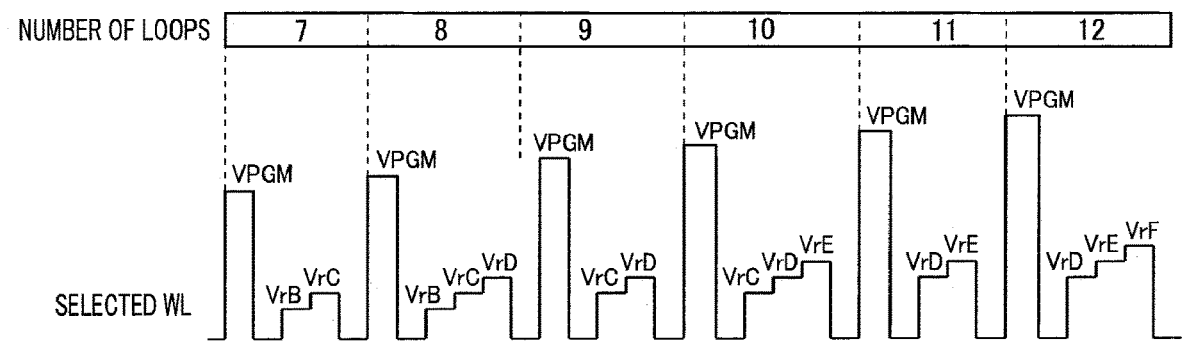
FIG. 10 is an explanatory diagram respectively illustrating changes in voltages to be applied to a word line WL in general program operation and verify operation.

FIG. 10 is an explanatory diagram respectively illustrating changes in voltage applied to a word line WL in the general program operation and verify operation. An example illustrated in FIG. 10 corresponds to 7th to 12th loops illustrated in FIG. 8. As illustrated in FIG. 10, a program voltage VPGM becomes larger voltage value for each of the loops. In the 7th loop, memory cells MT at a B level and a C level are verified, as illustrated in FIG. 8. In other words, it is judged whether the memory cell at the B level is in a writing insufficient cell state or a writing completed cell state, with a B verify level (VrB) for performing the verify operation for the B level (hereinafter referred to as B verify) applied to the word line WL after the program voltage VPGM is applied, as illustrated in FIG. 10. The sense amplifier circuit 32 judges that the B verify is verify-failed when the memory cell at the B level is the writing insufficient cell and judges that the B verify is verify-passed when the memory cell at the B level is the writing completed cell.

Next, it is judged whether the memory cell at the C level is in a writing insufficient cell state or a writing completed cell state, with a verify level (VrC) for performing the verify operation for the C level (hereinafter referred to as C verify) applied to the word line WL. The sense amplifier circuit 32 judges that the C verify is verify-failed when the memory cell at the C level is the writing insufficient cell and judges that the C verify is verify-passed when the memory cell at the C level is the writing completed cell.

In the 8th loop, a verify operation for the D level (hereinafter referred to as D verify) is performed subsequently to the B verify and the C verify. In the D verify, it is judged whether the memory cell at the D level is in a writing insufficient cell state or a writing completed cell state, with a verify level (VrD) applied to the word line WL. The sense amplifier circuit 32 judges that the D verify is verify-failed when the memory cell at the D level is the writing insufficient cell and judges that the D verify is verify-passed when the memory cell at the D level is the writing completed cell.

Thus, the control section 22 applies A to G verify levels (VrA to VrG), respectively, in verify for A to G levels (A verify to G verify), and the sense amplifier circuit 32 judges whether the memory cell is verify-failed or verify-passed. The memory cell that is judged to be verify-passed is inhibited from being written in, and for the memory cell that is judged to be verify-failed, writing is continued in a subsequent loop while increasing the program voltage VPGM according to the writing sequence illustrated in FIG. 8.

(Program Slope)

Next, a variation of a device characteristic caused by a variation of a program slope will be described with reference to FIGS. 15 to 18.

Writing into a memory cell is performed according to a predetermined writing sequence by a plurality of loops, as described above. A program voltage VPGM to be applied to the memory cell for each of the loops changes, and a threshold voltage Vth changes by a change amount (hereinafter referred to as a step-up voltage) $\Delta$VPGM of the program voltage VPGM. A ratio ($\Delta$Vth/$\Delta$VPGM) of a change amount $\Delta$Vth of the threshold voltage Vth and the step-up voltage $\Delta$VPGM of the program voltage is referred to as a program slope.

The program slope is a value determined by a film thickness, a dielectric constant, a memory hole diameter, and the like of a MANOS (metal-alumina-nitride-oxide-silicon) film. With the memory cell being three-dimensionally structured, film formation and processing difficulties are significantly high, and uniformity of the MANOS film deteriorates. Accordingly, the program slope easily varies.

Figure 15:
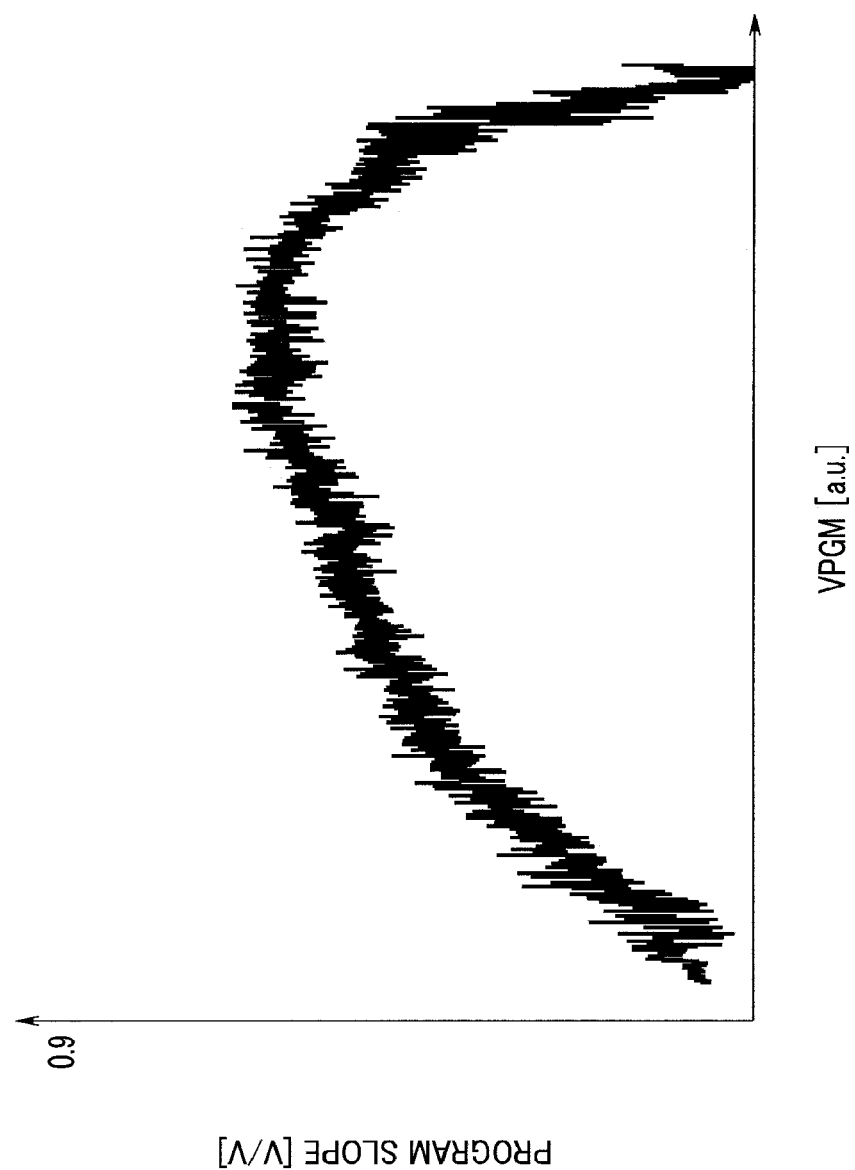
FIG. 15 is a graph illustrating writing voltage dependency of a program slope for each of memory cells in a memory cell array 23 with a program voltage VPGM on a horizontal axis and the program slope on a vertical axis.

FIG. 15 is a graph illustrating writing voltage dependency of a program slope for each of memory cells in the memory cell array 23 with a program voltage VPGM on a horizontal axis and a program slope on a vertical axis. As illustrated in FIG. 15, the program slope changes depending on the program voltage VPGM, and a rate of change of the program slope is not constant. For example, FIG. 15 illustrates such a tendency that the higher the program voltage VPGM becomes, the higher the program slope becomes.

Figure 16:
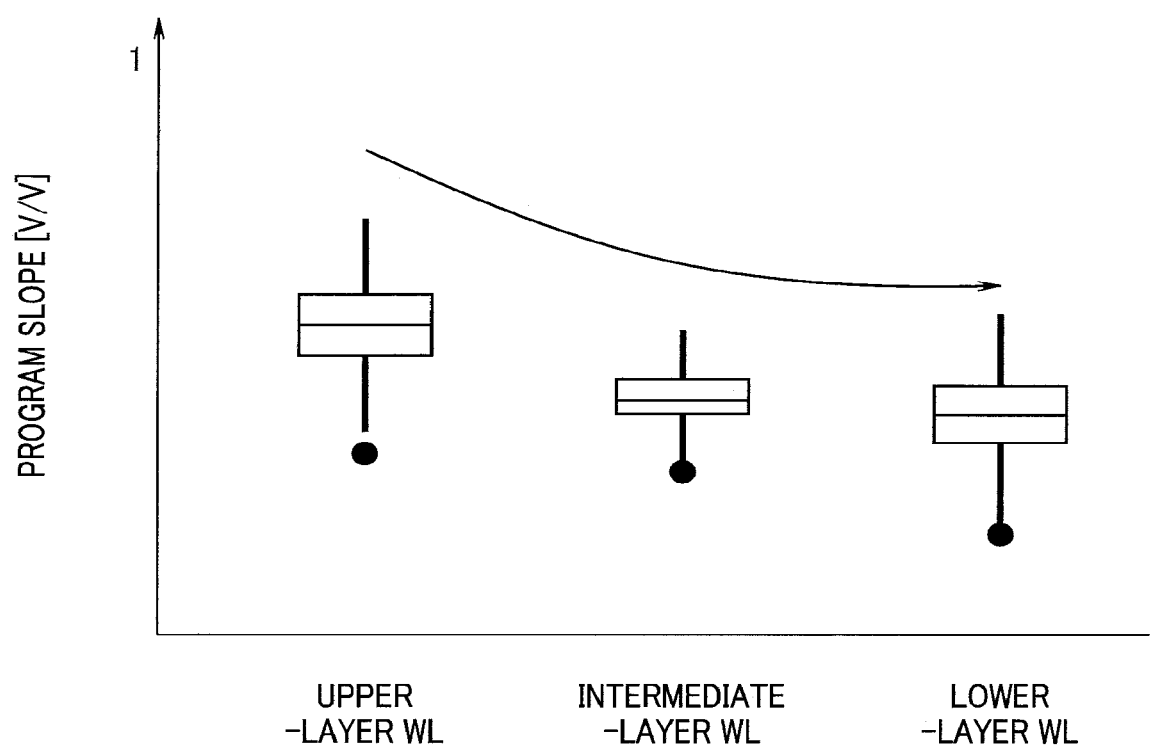
FIG. 16 is a graph illustrating word line dependency of a program slope with positions of a word line WL on a horizontal axis and the program slope on a vertical axis.

FIG. 16 is a graph illustrating word line dependency of a program slope with positions (an upper layer, an intermediate layer, and a lower layer) of a word line WL on a horizontal axis and a program slope on a vertical axis. In FIG. 16, for the word line WL at an upper layer position, an intermediate layer position, and a lower layer position of a three-dimensional structure, the number of memory cells is indicated by a lateral bar graph for each value of the program slope. In the three-dimensional structure, the program slope changes depending on the position of the word line WL, a change in a median value of the program slope roughly has a characteristic as indicated by a curved arrow, and a rate of change is not constant, as illustrated in FIG. 16, due to a difference in a memory hole diameter depending on the position of the word line WL.

Figure 17:
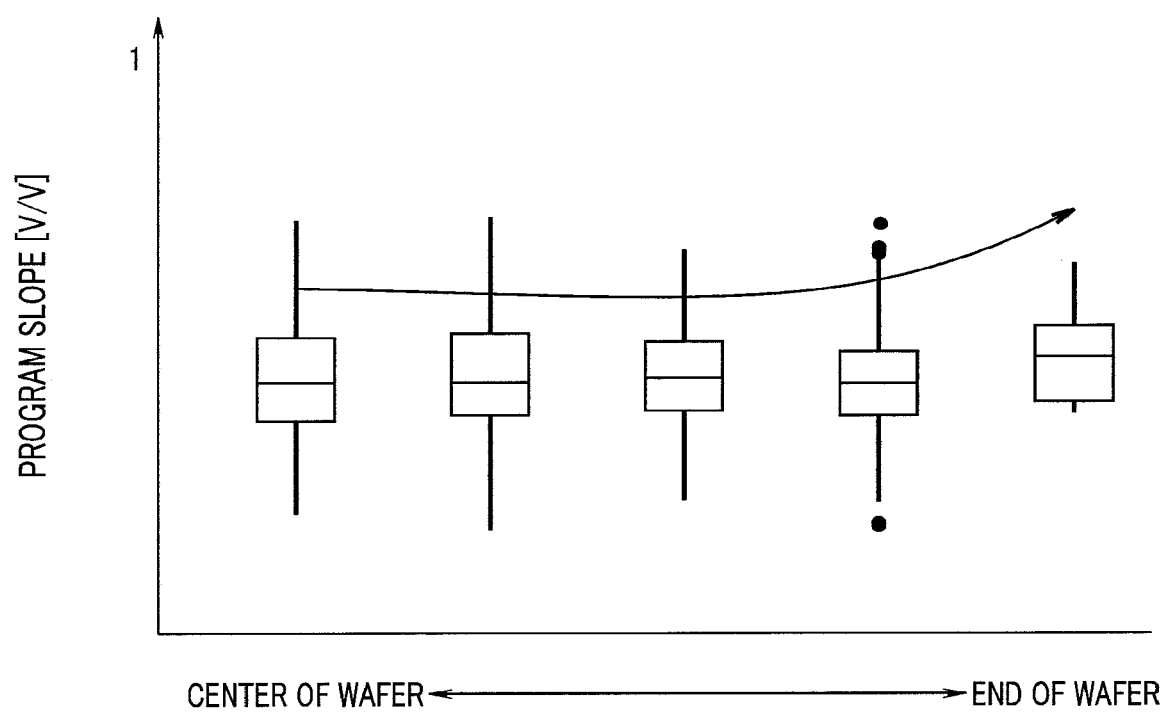
FIG. 17 is a graph illustrating chip position dependency of a program slope with a chip position corresponding to a distance from a center of a wafer on a horizontal axis and the program slope on a vertical axis.

FIG. 17 is a graph illustrating chip position dependency of a program slope with a chip position corresponding to a distance from a center of a wafer on a horizontal axis and a program slope on a vertical axis. In FIG. 17, a value of the program slope for each of memory cells is plotted for chips respectively formed at a predetermined position in the vicinity of the center of the wafer, a predetermined position in the vicinity of an end of the wafer, and predetermined three positions between these positions, a square frame indicates that the number of plots is a predetermined number of cells or more, and a central horizontal line of the square frame represents a median value. As illustrated in FIG. 17, the program slope changes depending on a position on the wafer where the chip is formed, a change of the median value roughly has a characteristic as indicated by a curved arrow, and a rate of change is not constant with respect to a distance from the center of the wafer.

Thus, the program slope varies depending on a chip position, a position of the word line WL, and a program voltage. A program time period and a threshold distribution vary depending on the variation of the program slope.

Figure 18:
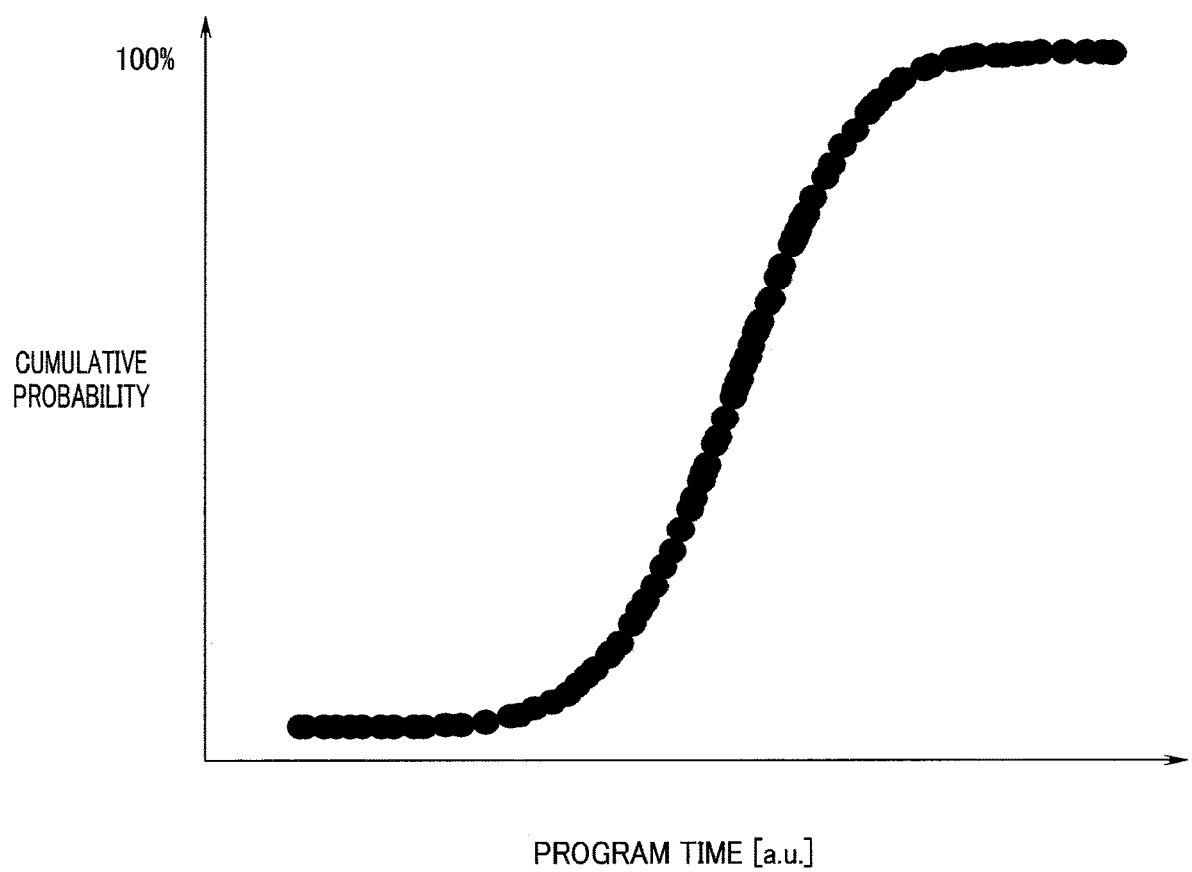
FIG. 18 is a graph illustrating a variation of a writing time period with a program time on a horizontal axis and a cumulative probability on a vertical axis.

FIG. 18 is a graph illustrating a variation of a writing time period with a program time period on a horizontal axis and a cumulative probability on a vertical axis. Since the program slope varies, the writing time period varies, as illustrated in FIG. 18.

Thus, a threshold distribution and a writing time period vary due to the variation of the program slope. The program slope varies depending on a program voltage VPGM, a word line WL, and a chip position, and it is difficult to predict the variation of the program slope in advance and perform writing control for preventing the threshold distribution and the writing time period from varying.

(Control of Step-Up Voltage $\Delta$VPGM)

In the present embodiment, the program voltage VPGM is set depending on the verify result of each of the loops in the writing sequence by utilizing the verify result variation depending on the variation of the program slope so that the variation of the device characteristic due to the program slope can be prevented. To use the verify result of each of the loops, the bit scan circuit 33 is provided.

In FIG. 9, the bit scan circuit 33 counts the number of memory cells that are verify-passed for each of the A to G levels based on the verify result held by the latch circuit 325, for example. The bit scan circuit 33 includes a scan circuit 33a, a counter 33b, and a memory 33c, for example. The scan circuit 33a scans (detects) a data holding state of the latch circuit 32S in the writing sequence. The scan circuit 33a detects the number of memory cells that are verify-passed for each of the A to G levels. The counter 33b counts the number of memory cells detected by the scan circuit 33a for each of loops in the writing sequence and for each of the levels A to G, and stores a count value in the memory 33c. In other words, the memory 33c stores the number of verify pass cells for each of the loops and for each of the levels. Note that the bit scan circuit 33 may count not only the number of memory cells in which data writing is completed but also the number of memory cells in which data writing is not completed, i.e., the number of memory cells that are verify-failed.

The bit scan circuit 33 obtains information about the number of verify pass cells or verify fail cells for each of the loops in the writing sequence and for each of the levels and outputs the information to the operation unit 34. The operation unit 34 performs operation processing using the information from the bit scan circuit 33, and outputs an operation result to the control section 22.

Note that in the present embodiment, the bit scan circuit 33 and the operation unit 34 may detect a change amount of the respective numbers of verify pass cells or the respective numbers of verify fail cells in the two consecutive loops, and the counter 33b may integrate the number of verify pass cells or the number of verify fail cells for each of the levels or may count the number of verify pass cells or the number of verify fail cells for only one or more predetermined levels.

The control section 22 judges whether or not adjustment of an applied voltage and a writing operation or a reading operation are appropriate based on the operation result of the operation unit 34. The operation result of the operation unit 34 may be directly transferred to the control section 22, or may be held in the latch circuit 32S in the column unit CU.

In the present embodiment, the operation unit 34 obtains, for the memory cells having the same level, a difference between the respective numbers of memory cells that are verify-passed (numbers of verify pass cells) or a difference between the respective numbers of memory cells that are verify-failed (numbers of verify fail cells) in the different loops.

The control section 22 includes a register 22a storing a table for determining a correspondence between the difference between the respective numbers of verify pass cells or the difference between the respective numbers of verify fail cells and the step-up voltage ΔVPGM. A setting content of the register 22a can be appropriately changed under control of the host. The control section 22 determines a step-up voltage ΔVPGM of a program voltage in a subsequent loop depending on the difference between the respective numbers of verify pass cells or the difference between the respective numbers of verify fail cells, which is obtained by the operation unit 34. For example, the control section 22 may determine a step-up voltage ΔVPGM based on an operation result by the operation unit 34 and information about the table stored in the register 22a.

For example, in order to determine a step-up voltage ΔVPGM in the N-th loop (N is an integer of 3 or more) in the writing sequence, the control section 22 reads out the difference between the respective numbers of verify pass cells or the difference between the respective numbers of verify fail cells in the (N−2)th loop and the (N−1)th loop from the operation unit 34, and determines the step-up voltage ΔVPGM based on the difference.

For example, the control section 22 sets the step-up voltage ΔVPGM to a relatively large value, assuming that the program slope is relatively small when the difference between the respective numbers of verify pass cells is relatively small, that is, the number of cells that have changed from verify-failed to verify-passed by applying the program voltage VPGM in the (N−1)th loop is relatively small. On the other hand, the control section 22 sets the step-up voltage ΔVPGM to a relatively small value, assuming that the program slope is relatively large when the difference between the respective numbers of verify pass cells is relatively large, that is, the number of cells that have changed from verify-failed to verify-passed by applying the program voltage VPGM in the (N−1)th loop is relatively large.

As a result, a threshold distribution can be prevented from varying and a writing time period can be prevented from varying regardless of the variation of the program slope. Control of the step-up voltage ΔVPGM by the number of verify pass cells or the number of verify fail cells is performed for each of the loops in the writing sequence, and therefore is not affected by a variation of the program slope dependent on a position of the word line WL and a chip position.

Note that the control section 22 may have substantially the same function as the function of at least one of the bit scan circuit 33 and the operation unit 34, and either one of the bit scan circuit 33 and the operation unit 34 may perform counting, a difference operation, and determination of the step-up voltage ΔVPGM. For example, the operation unit 34 may determine a value of the step-up voltage ΔVPGM and output information about the step-up voltage ΔVPGM to the control section 22.

Next, an operation according to the embodiment thus configured will be described with reference to FIGS. 11 to 14. FIGS. 11 to 14 are explanatory diagrams for each describing a method of determining a step-up voltage ΔVPGM in the present embodiment. FIG. 11 describes a loop used for determining the step-up voltage ΔVPGM using a writing sequence of 18 loops as an example, and FIG. 12 describes voltages to be respectively applied to a selected word line WL in the 7th to 14th loops illustrated in FIG. 11. FIG. 13 illustrates a relationship between a threshold distribution and verify pass cells with a voltage on a horizontal axis, and FIG. 14 illustrates a setting example of the step-up voltage ΔVPGM.

In FIG. 11, A to G and round marks indicate that A to G verify at A to G verify levels may be performed in loops corresponding to the round marks. FIG. 11 illustrates a relationship between the verify pass cells in the (N−2)th loop and the verify pass cells in the (N−1)th loop that are used to determine the step-up voltage ΔVPGM in the N-th loop in each of the 1st to 18th loops. Note that although an example in which the verify pass cells are used to determine the step-up voltage ΔVPGM is described in the following description, verify fail cells may be used, as described above.

A hatched portion illustrated in FIG. 11 represents that a verify operation in which the number of verify pass cells is to be measured is performed in the bit scan circuit 33. Note that the verify operation in which the number of verify pass cells is to be measured is not limited to the example illustrated in FIG. 11. In the example illustrated in FIG. 11, the number of verify pass cells is measured only for the A verify in each of the 1st to 3rd loops, and the number of verify pass cells is measured for the A verify and the B verify in the 4th loop. Similarly, the number of verify pass cells is measured for the B verify in each of the 4th to 6th loops, the number of verify pass cells is measured in the 6th to 8th loops for the C verify, the number of verify pass cells is measured in the 8th to 10th loops for the D verify, the number of verify pass cells is measured in the 10th to 12th loops for the E verify, the number of verify pass cells is measured in the 12th to 14th loops for the F verify, and the number of verify pass cells is measured in the 14th to 17th loops for the G verify.

In the present embodiment, when a step-up voltage ΔVPGM which is a difference between a program voltage VPGM in an (N−1)th loop and a program voltage VPGM in an N-th loop is represented by a step-up voltage ΔVPGM_N, for example, the step-up voltage ΔVPGM_N is set depending on a difference between the respective numbers of verify pass cells in an (N−2)th loop and the (N−1)th loop that have been acquired by the same verify level. A column of verify pass cells to be detected in FIG. 11 indicates with which verify result the number of verify pass cells used to calculate the step-up voltage ΔVPGM is detected. In other words, in the column illustrated in FIG. 11, verify levels are respectively represented by A to G, and loops are respectively represented by numerals as suffixes. For example, "B5" indicates that the number of verify pass cells obtained by a result of the B verify in the 5th loop is used to calculate the step-up voltage ΔVPGM. For example, "C7" indicates that the number of verify pass cells obtained by a result of the C verify in the 7th loop is used to calculate the step-up voltage ΔVPGM.

Figure 12:
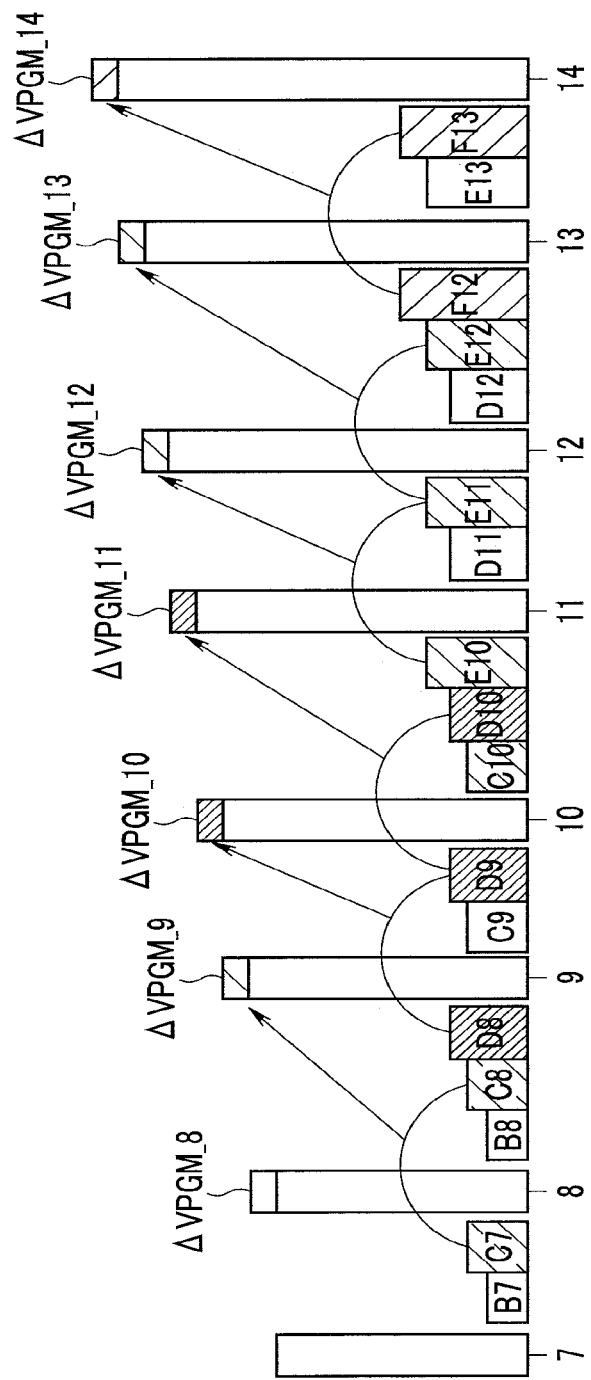
FIG. 12 is an explanatory diagram for describing voltages to be respectively applied to a selected word line WL in 7th to 14th loops illustrated in FIG. 11.
Figures 13, 14:
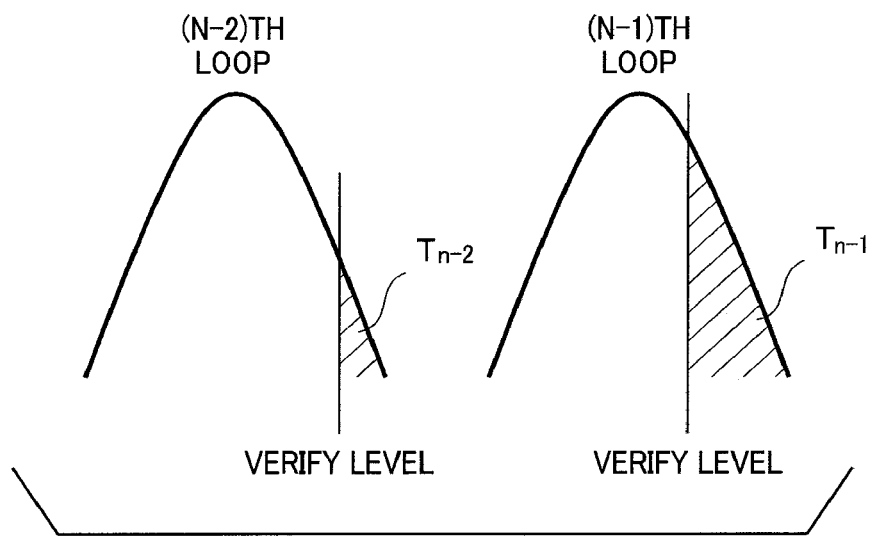
FIG. 13 is an explanatory diagram illustrating a relationship between a threshold distribution and verify pass cells with a voltage on a horizontal axis.
FIG. 14 is an explanatory diagram illustrating a setting example of a step-up voltage ΔVPGM.

For example, as illustrated in FIGS. 11 and 12, a difference between the respective numbers of verify pass cells obtained by the C verify in the 7th and 8th loops is used to determine a step-up voltage ΔVPGM_9 to be applied to a program voltage VPGM in the 8th loop in setting a program voltage VPGM in the 9th loop. For example, a difference between the respective numbers of verify pass cells obtained by the E verify in each of the 10th and 11th loops is used to determine a step-up voltage ΔVPGM_12 to be applied to a program voltage VPGM in the 11th loop in setting a program voltage VPGM in the 12th loop.

In general writing, writing is performed such that the respective numbers of cells at the A to G levels in a predetermined region of the memory cell array 23 are substantially equal. Therefore, by setting the step-up voltage ΔVPGM depending on the difference between the respective numbers of verify pass cells in the (N−2)th loop and the (N−1)th loop at the same verify level, a variation of the program slope can be prevented from affecting writing at all levels even if the verify level used to measure the number of verify pass cells is any level.

FIG. 13 illustrates respective verify passes at the predetermined same verify levels in a threshold distribution obtained by writing in an (N−2)th loop and a threshold distribution obtained by writing in an (N−1)th loop by hatching. An example illustrated in FIG. 13 indicates that $T_{n-2}$ verify pass cells are obtained by writing in the (N−2)th loop and $T_{n-1}$ verify pass cells are obtained by writing in the (N−1)th loop.

FIG. 14 illustrates an example of information stored in the register 22a, and illustrates a setting example of a step-up voltage ΔVPGM corresponding to a difference $(T_{n-1}-T_{n-2})$ between the respective numbers of verify pass cells per 1 kB of the memory cell array 23. In FIG. 14, voltages V1 to V6 satisfy V1>V2>V3>V4>V5>V6. A difference between the adjacent voltages among the voltages V1 to V6 may be set to 0.01 V, for example, and each of the voltages V1 to V6 can be appropriately set. As illustrated in FIG. 14, the register 22a stores information for increasing a step-up voltage ΔVPGM_N as the difference $(T_{n-1}-T_{n-2})$ between the respective numbers of verify pass cells becomes smaller, that is, the number of verify pass cells that have newly occurred by a step-up voltage ΔVPGM_N−1 at the time of previous writing becomes smaller and decreasing the step-up voltage ΔVPGM_N as the number of verify pass cells that have newly occurred becomes larger.

The control section 22 refers to the register 22a using a difference between the respective numbers of verify pass cells in the (N−2)th and (N−1)th loops to determine a step-up voltage ΔVPGM set in an N-th loop, for example. As a result, the step-up voltage ΔVPGM is relatively large if an increase in the number of verify pass cells is relatively small, and the step-up voltage ΔVPGM is relatively small if the increase in the number of verify pass cells is relatively large. Thus, a writing time period and a threshold distribution are prevented from varying.

Thus, in the present embodiment, at the time of writing into the memory cell array 23, the step-up voltage ΔVPGM is set to prevent an increased number of verify pass cells or an increased number of verify fail cells for each of the loops from varying due to an effect of the program slope. The step-up voltage ΔVPGM is set using a measurement result of the number of verify pass cells or the number of verify fail cells. The threshold distribution and the writing time period can be prevented from varying regardless of a position of a chip on a wafer, a vertical position of a word line WL on the chip, and a variation of the program slope due to the program voltage VPGM or the like.

(Modification)

Note that a method of obtaining a step-up voltage ΔVPGM is not limited to the method in the foregoing example. Although an example in which the number of verify pass cells or the number of verify fail cells for each of the levels is counted has been described, for example, the respective numbers of verify pass cells or the respective numbers of verify fail cells in an (N−2)th loop and an (N−1)th loop may be counted for all the levels.

In a writing sequence, a program slope is particularly unstable in first few loops. Accordingly, when a step-up voltage ΔVPGM is set using the number of verify pass cells or the number of verify fail cells in this period, a threshold distribution and a writing time period may rather vary. Although the number of verify pass cells is counted from the 1st loop and the step-up voltage ΔVPGM is set based on a count value from the 3rd loop in the above-described embodiment, a loop for starting control of the step-up voltage ΔVPGM may be selectable. For example, the number of verify pass cells may be counted from the 2nd or 3rd loop, and the step-up voltage ΔVPGM may be controlled from the 4th or 5th loop.

Alternatively, the number of verify pass cells or the number of verify fail cells may be counted from the 1st loop, a variation of the number of verify pass cells or the number of verify fail cells may be observed, and depending on a state of the variation, a loop for starting to set the step-up voltage ΔVPGM may be determined. For example, the step-up voltage ΔVPGM may be controlled using respective results of measurements in loops subsequent to the loop in which a change amount of the number of verify pass cells or the number of verify fail cells falls within a predetermined threshold value.

If the number of verify pass cells is significantly small, a difference between the respective numbers of verify pass cells in the loops cannot reflect a variation of a program slope. While the number of verify pass cells is counted from the 1st loop, control of the step-up voltage ΔVPGM based on a count value may not be started until the count value exceeds a predetermined count value.

In the above-described embodiment, an example in which the step-up voltage ΔVPGM is obtained and set based on a count value of the number of verify pass cells or the number of verify fail cells in all loops subsequent to the 3rd loop has been described. However, a program performance may deteriorate due to a processing time period of the processing. In the relatively first few loops (e.g., the 3rd to 5th loops) of one writing sequence into a selected word line WL, the step-up voltage ΔVPGM may be determined based on a count value of the number of verify pass cells or the number of verify fail cells only once. For example, the respective numbers of verify pass cells are measured in the 3rd and 4th loops, the step-up voltage ΔVPGM is set based on a measurement result in the 5th loop, and the step-up voltage ΔVPGM is adopted in the subsequent loops. Although an effect of the variation of the program slope dependent on the program voltage VPGM cannot be avoided in this case, the step-up voltage ΔVPGM is determined for each writing into each of the selected word lines WL so that respective effects of chip position dependency and position dependency of the word line WL can be avoided.

Note that if counting of the number of verify pass cells and calculation of the step-up voltage ΔVPGM do not affect the program performance, counting of the number of verify pass cells or the number of verify fail cells and setting of the step-up voltage ΔVPGM based on a count value may be performed in all loops subsequent to the relatively first few loops, like in the above-described embodiment.

Although an example in which the above-described embodiment is applied to a writing sequence using a sequential writing system has been described, the embodiment can also be applied to any writing system. For example, the embodiment may be applied to foggy-fine system, may be applied to a fine writing, or may be applied to an LM fine writing.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
    a plurality of memory cells;
    a word line connected to respective gates of the plurality of memory cells;
    a word line driver configured to be able to apply a program voltage to the word line when writing data into the plurality of memory cells;
    a plurality of bit lines electrically connected to respective one ends of the plurality of memory cells;
    a bit line driver configured to be able to detect data in the plurality of memory cells via the plurality of bit lines by applying a bit line voltage to the plurality of bit lines; and
    a control circuit configured to control the word line driver and the bit line driver, to be able to execute a writing sequence for repeating at least one loop including a program operation for writing data into at least one of the plurality of memory cells and a verify operation for verifying the data written into the at least one of the plurality of memory cells a plurality of times while increasing the program voltage by a step-up voltage, wherein
    the bit line driver can obtain a number of memory cells into which writing is completed or a number of memory cells into which writing is insufficient for each of the at least two consecutive loops from a result of the verify operation, and
    the control circuit can determine the step-up voltage in the subsequent loop based on a result obtained by the bit line driver.

2. The semiconductor storage device according to claim 1, wherein
    the control circuit decreases the step-up voltage as an amount of increase in the number of memory cells into which writing is completed increases or as an amount of decrease in the number of memory cells into which writing is insufficient increases.

3. The semiconductor storage device according to claim 1, wherein
    the control circuit increases the step-up voltage as an amount of increase in the number of memory cells into which writing is completed decreases or as an amount of decrease in the number of memory cells into which writing is insufficient decreases.

4. The semiconductor storage device according to claim 1, wherein
    the control circuit determines one or a plurality of threshold values, and decreases the step-up voltage when the number of memory cells into which writing is completed exceeds the threshold value and increases the step-up voltage when the number of memory cells into which writing is completed falls below the threshold value.

5. The semiconductor storage device according to claim 1, wherein
    the control circuit determines one or a plurality of threshold values, and increases the step-up voltage when the number of memory cells into which writing is insufficient exceeds the threshold value and decreases the step-up voltage when the number of memory cells into which writing is insufficient falls below the threshold value.

6. The semiconductor storage device according to claim 1, wherein
    the bit line driver can obtain the number of memory cells into which writing is completed or the number of memory cells into which writing is insufficient from a second and subsequent loops in the writing sequence.

7. The semiconductor storage device according to claim 6, wherein
    the bit line driver can obtain the number of memory cells into which writing is completed or the number of memory cells into which writing is insufficient from a loop in which a change amount of the number of memory cells into which writing is completed or the number of memory cells into which writing is insufficient exceeds a predetermined threshold value and subsequent loops.

8. The semiconductor storage device according to claim 1, wherein
    the bit line driver can obtain the number of memory cells into which writing is completed or the number of memory cells into which writing is insufficient from a first loop in the writing sequence.

9. The semiconductor storage device according to claim 8, wherein
the control circuit determines the step-up voltage based on a difference between respective numbers of memory cells into which writing is completed in two consecutive loops subsequent to a loop in which the number of memory cells into which writing is completed exceeds a predetermined threshold value or the number of memory cells into which writing is insufficient falls below the predetermined threshold value, the number of memory cells into which writing is completed or the number of memory cells into which writing is insufficient being obtained by the bit line driver.

10. The semiconductor storage device according to claim 6, wherein
the bit line driver obtains the number of memory cells into which writing is completed or the number of memory cells into which writing is insufficient consecutively to a second to last loop of the writing sequence.

11. The semiconductor storage device according to claim 8, wherein
the bit line driver obtains the number of memory cells into which writing is completed or the number of memory cells into which writing is insufficient consecutively to a second to last loop of the writing sequence.

12. The semiconductor storage device according to claim 1, wherein
the control circuit determines the step-up voltage used in loops subsequent to an n-th loop (n is a natural number of two or more) based on a difference between the respective numbers of memory cells, which is obtained by the bit line driver, in the n-th loop in the writing sequence.

13. The semiconductor storage device according to claim 12, wherein
the n is any one of 3 to 5.

14. The semiconductor storage device according to claim 1, wherein
the control circuit writes multivalued data in the writing sequence, and
the control circuit determines the predetermined step-up voltage based on a change amount of the number of memory cells into which writing is completed or a change amount of the number of memory cells into which writing is insufficient, which is obtained by the bit line driver, from a result for data having a same value among results of verify operations in the plurality of loops.

15. The semiconductor storage device according to claim 14, wherein
the control circuit determines the predetermined step-up voltage based on the change amount of the number of memory cells into which writing is completed or the change amount of the number of memory cells into which writing is insufficient, which is obtained by the bit line driver, from a result of the verify operation for verifying data having a value corresponding to a highest level among levels of threshold voltages respectively assigned to the multivalued data.

16. The semiconductor storage device according to claim 1, wherein
the bit line driver comprises
a bit scan circuit configured to be able to obtain the number of memory cells into which writing is completed or the number of memory cells into which writing is insufficient after the loop ends, and
a latch circuit configured to be able to store the number of memory cells into which writing is completed or the number of memory cells into which writing is insufficient after the loop ends.

17. A semiconductor storage device comprising:
a scan circuit configured to scan a latch circuit which is connected to a sense circuit and which is configured to store a result of a verify operation for verifying data written into at least one of a plurality of memory cells, the scan circuit being configured to read out the result of the verify operation, the sense circuit being configured to detect respective levels of a plurality of bit lines in a memory cell array including the plurality of memory cells, a word line connected to respective gates of the plurality of memory cells, a word line driver configured to be able to apply a program voltage to the word line at the time of writing the data into the plurality of memory cells, and the plurality of bit lines electrically connected to respective one ends of the plurality of memory cells;
a counter configured to obtain, in a writing sequence for repeating a plurality of loops while increasing the program voltage by a step-up voltage, a number of memory cells into which writing is completed or a number of memory cells into which writing is insufficient for each of the loops from a result of the verify operation performed for the each of the loops, the result being read out by the scan circuit; and
a memory configured to store the number of memory cells into which writing is completed or the number of memory cells into which writing is insufficient, which is obtained by the counter, corresponding to at least one of the loops.

* * * * *